United States Patent
Pascal et al.

(10) Patent No.: US 6,505,417 B2
(45) Date of Patent: *Jan. 14, 2003

(54) METHOD FOR CONTROLLING AIRFLOW ON A BACKSIDE OF A SEMICONDUCTOR WAFER DURING SPIN PROCESSING

(75) Inventors: Roy Winston Pascal, Union City; Brian M. Bliven, San Jose, both of CA (US)

(73) Assignee: Lam Research Corporation, Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 09/471,590

(22) Filed: Dec. 23, 1999

(65) Prior Publication Data

US 2002/0112371 A1 Aug. 22, 2002

(51) Int. Cl.[7] .................................................. F26B 3/00
(52) U.S. Cl. ............................. 34/509; 34/360; 34/364; 34/487; 34/498; 118/320; 118/500
(58) Field of Search ............................ 34/58, 360, 364, 34/487, 498, 509; 118/52, 319, 320, 500

(56) References Cited

U.S. PATENT DOCUMENTS

| | | | | |
|---|---|---|---|---|
| 4,544,446 A | * | 10/1985 | Cady | 156/639 |
| 5,679,405 A | * | 10/1997 | Thomas et al. | 427/248.1 |
| 5,725,663 A | * | 3/1998 | Parrette | 118/52 |
| 5,884,412 A | * | 3/1999 | Tietz et al. | 34/58 |
| 5,960,555 A | * | 10/1999 | Deaton et al. | 34/58 |
| 6,273,104 B1 | | 8/2001 | Shinbara et al. | 134/25.4 |

* cited by examiner

Primary Examiner—Pamela Wilson
(74) Attorney, Agent, or Firm—Martine & Penilla, LLP

(57) ABSTRACT

In a method for controlling airflow on a backside of a semiconductor wafer during spin processing, a wafer backing plate is first disposed below a semiconductor wafer. Air is then supplied to the volume defined by the wafer backing plate and the semiconductor wafer. The air may be supplied to the volume through a hollow core spindle, a rotary union, or apertures in the wafer backing plate. The separation distance between the wafer and the wafer backing plate and the flow rate of air supplied to the volume may be controlled to avoid any substantial recirculation of contaminated air into the volume. In addition to serving as one of the boundaries that define the volume, the wafer backing plate reduces particle recontamination on the backside of the wafer by preventing particles from contacting the backside of the wafer during spin processing.

17 Claims, 8 Drawing Sheets

METHOD FOR CONTROLLING AIRFLOW ON A BACKSIDE OF A SEMICONDUCTOR WAFER DURING SPIN PROCESSING

BACKGROUND OF THE INVENTION

The present invention relates generally to semiconductor fabrication and, more particularly, to a method for controlling airflow on a backside of semiconductor wafer during spin processing and a method for reducing particle recontamination on a backside of a semiconductor wafer during spin processing.

As the semiconductor industry moves to larger, e.g., 300 mm, wafers and to smaller, e.g., 0.18 μm and smaller, feature sizes, it is becoming increasingly more important to control wafer contamination on the backside, i.e., the bottom side, of wafers during wafer preparation operations. In one conventional wafer preparation operation, a wafer is spin rinsed in a spin, rinse, and dry (SRD) module. During this spin rinsing operation, deionized (DI) water is sprayed onto the top side and the backside of a wafer as the wafer is spun at high speed. One problem with this spin rinsing operation is that recirculating air from above the wafer often causes particle recontamination on the backside of the wafer.

FIG. 1 is a simplified schematic diagram 10 illustrating the airflow around a wafer in a conventional bowl, which forms part of an SRD module. As shown therein, wafer 12 is disposed in bowl 14. For ease of illustration, the spindle, which spins the wafer, and the spindle fingers, which support the wafer above the spindle, have been omitted from FIG. 1. As wafer 12 spins in bowl 14, the spinning action of the wafer transfers energy to the air flowing to the top side of the wafer. This transferred energy causes the airflow above the top side of wafer 12 to become turbulent and creates recirculating air, i.e., eddies, as indicated by the arrows in FIG. 1. The amount of energy transferred to the air flowing to the top side of wafer 12 depends on the diameter and the rotational speed of the wafer. In general, the greater the amount of energy transferred to the air, the higher the eddies extend above the top side and the farther the eddies extend below the backside of wafer 12. The presence of eddies below wafer 12 is undesirable because particles or DI water droplets removed from the wafer can circulate in the eddies and be redeposited on the backside of the wafer, thereby causing recontamination.

In view of the foregoing, there is a need for a method for controlling the airflow on a backside of a wafer during spin processing to minimize the recontamination caused by particles and DI water droplets circulating in eddies below the wafer.

SUMMARY OF THE INVENTION

Broadly speaking, the present invention fills this need by controlling the airflow on the backside of a semiconductor wafer during spin processing so that contaminated air does not recirculate near the backside of the wafer. The present invention also reduces particle recontamination on the backside of a semiconductor wafer during spin processing by preventing particles from contacting the backside of the wafer.

In accordance with one aspect of the present invention, a method for controlling airflow on a backside of a semiconductor wafer during spin processing is provided. In this method a wafer backing plate is first disposed below a wafer. Air is then supplied to the volume defined by the wafer backing plate and the wafer. In one embodiment, the air is supplied to the volume proximate to the center portion of the backside of the wafer.

The air may be supplied to the volume between the wafer and the wafer backing plate in various manners. In one embodiment, the air is supplied to the volume through a hollow core spindle. In another embodiment, the air is supplied to the volume through a rotary union. In yet another embodiment, the wafer backing plate has a plurality of apertures formed therein and the air is supplied to the volume through the plurality of apertures. In this embodiment, the air supplied to the volume is provided by an air supply system including a plenum disposed below the wafer backing plate, a fan provided with either a HEPA filter or an ULPA filter, and an air duct for channeling air from the fan to the plenum.

The airflow on the backside of the wafer may be controlled by varying the separation distance between the wafer and the wafer backing plate and by varying the flow rate into the volume. In one embodiment, the distance the wafer backing plate is disposed below the wafer is in a range from about 80 thousandths of an inch to about 275 thousandths of an inch. In one embodiment, the operation of supplying air to the volume includes controlling the flow rate of the air supplied to the volume to avoid any substantial recirculation of contaminated air into the volume.

In one embodiment, the speed at which the semiconductor wafer rotates during spin processing is substantially the same as the speed at which the wafer backing plate rotates during spin processing. In one embodiment, the shape of the wafer backing plate substantially corresponds with that of the wafer.

In accordance with another aspect of the present invention, a method for reducing particle recontamination on a backside of a semiconductor wafer during spin processing is provided. In this method a wafer backing plate is disposed below the wafer to prevent particles from contacting the backside of the wafer. In one embodiment, the method is carried out in an SRD module.

The method for controlling airflow on a backside of a semiconductor wafer during spin processing of the present invention advantageously minimizes contamination on the backside of the wafer by preventing contaminated air from recirculating in the volume between the wafer and the wafer backing plate. The method further allows for flexible control of the airflow on the backside of the wafer by varying the flow rate into the volume and the separation distance between the wafer and the wafer backing plate. In addition, the wafer backing plate reduces particle recontamination on the backside of the wafer by preventing particles from contacting the backside of the wafer during spin processing.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
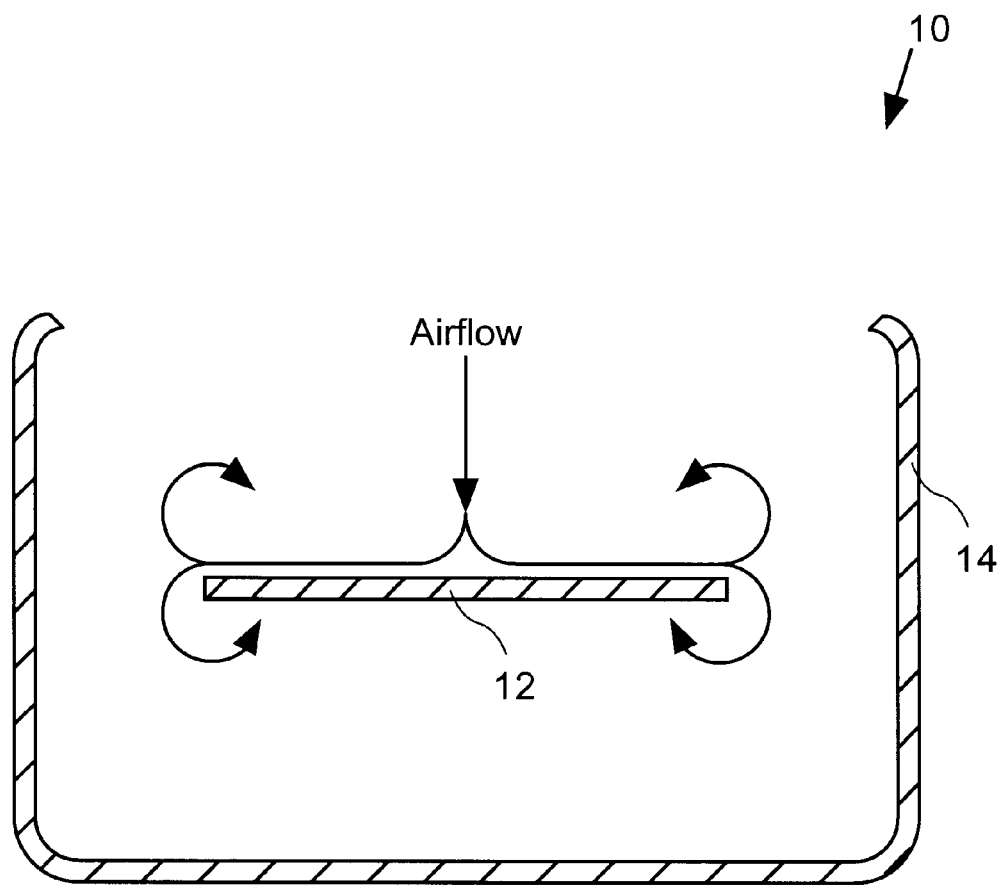
FIG. 1 is a simplified schematic diagram illustrating the airflow around a wafer in a conventional bowl.

Several exemplary embodiments of the invention will now be described in detail with reference to the accompanying drawings. FIG. 1 is discussed above in the "Background of the Invention" section.

Figure 2:
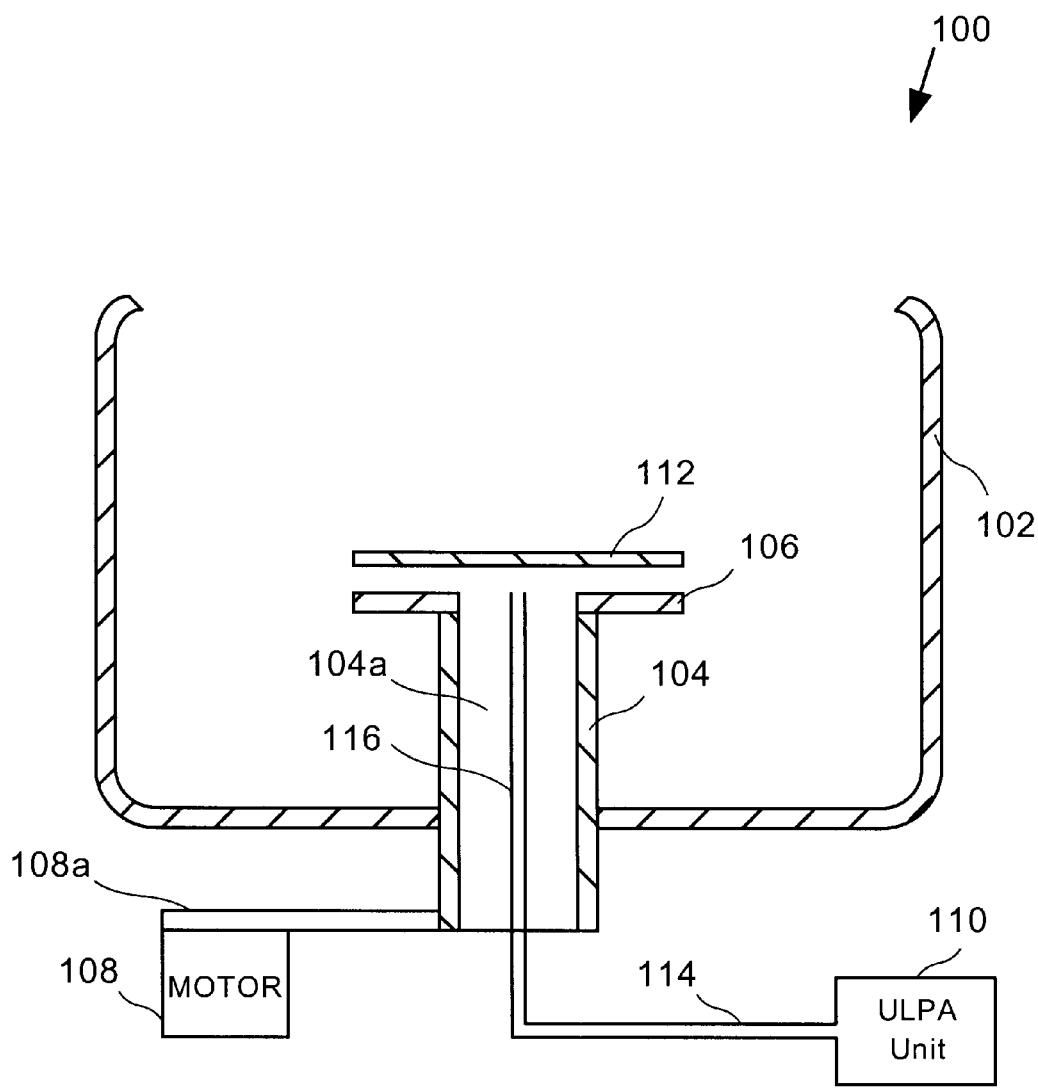
FIG. 2 is a simplified schematic diagram of a spin, rinse, and dry (SRD) module in accordance with one embodiment of the invention.

FIG. 2 is a simplified schematic diagram of spin, rinse, and dry (SRD) module 100 in accordance with one embodiment of the invention. As shown therein, SRD module 100 includes bowl 102, hollow core spindle 104, wafer backing plate 106, motor 108, drive mechanism 108a, and ultra low penetrating air (ULPA) filter unit 110. Semiconductor wafer 112 may be supported above hollow core spindle 104 and wafer backing plate 106 by any suitable support mechanism, e.g., spindle fingers that extend upwardly from a spindle arm coupled to the hollow core spindle. The spindle fingers and spindle arm, which are well known to those skilled in the art, have been omitted from FIG. 2 for ease of illustration.

Drive mechanism 108a, which is driven by motor 108, is coupled to the lower end of hollow core spindle 104 for rotating the spindle. In one embodiment, drive mechanism 108a is a belt, e.g., a timing belt. It will be apparent to those skilled in the art that other equivalent drive mechanisms also may be used to rotate hollow core spindle 104. Air supply tube 114 couples ultra low penetrating air (ULPA) filter unit 110 in flow communication with internal air supply tube 116.

Figure 3:
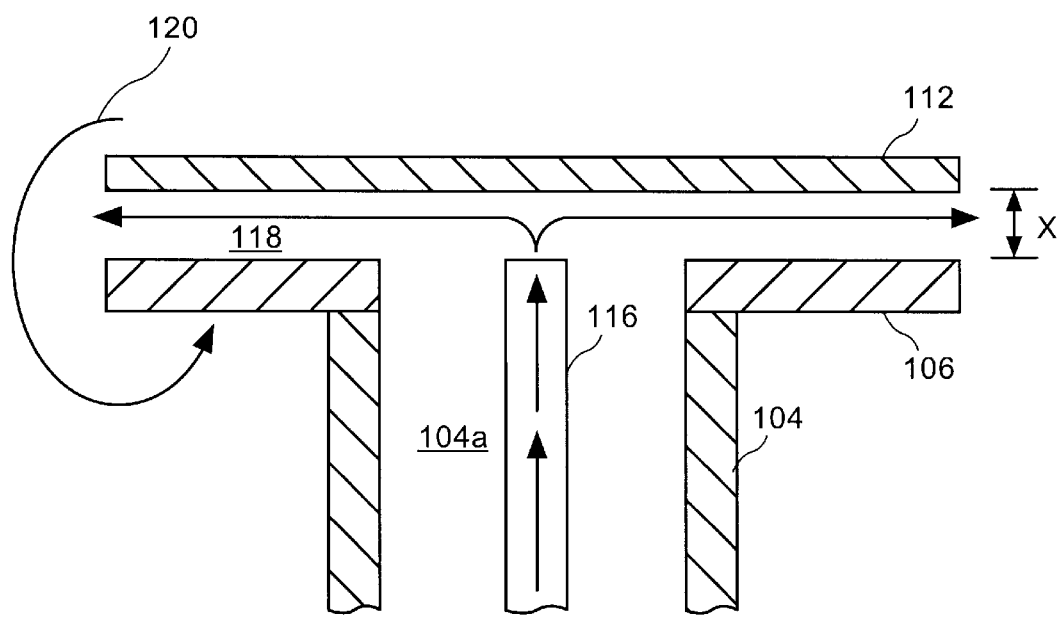
FIG. 3 is an enlarged view of the upper end of the hollow core spindle shown in FIG. 2 that illustrates the airflow on the backside of the wafer during spin processing.

FIG. 3 is an enlarged view of the upper end of hollow core spindle 104 shown in FIG. 2 that illustrates the airflow on the backside of wafer 112 during spin processing. As shown in FIG. 3, wafer backing plate 106 and wafer 112 define volume 118 therebetween. During spin processing, hollow core spindle 104, wafer backing plate 106, and wafer 112 rotate at substantially the same speed because they are coupled together. As hollow core spindle 104, wafer backing plate 106, and wafer 112 rotate, clean air from ULPA unit 110 flows up through internal air supply tube 116. In one embodiment, internal air supply tube 116 is disposed within channel 104a so that air is supplied to volume 118 proximate to the center portion of the backside of wafer 112. Internal air supply tube 116 may be secured within channel 104a with a bearing (not shown) at the top of hollow core spindle 104 and a bracket (not shown) at the bottom of the spindle. The clean air entering volume 118 from internal air supply tube 116 flows outwardly from the center portion of the backside of wafer 112 and exits volume 118 at the outer edges of wafer 112 and wafer backing plate 106, as indicated by the arrows in FIG. 3.

The distance, X, that wafer backing plate 106 is disposed below wafer 112 and the airflow into volume 118 from internal air supply tube 116 may be controlled so that contaminated air does not recirculate into volume 118. In general, the distance, X, is a function of the pressure of the air supplied to volume 118, the velocity of the airflow down onto the top side of wafer 112, and the spindle speed. By way of example, the $\Delta P$ of the air supplied to volume 118 may be varied from 0 to 10 inches of water, as a function of the velocity of the airflow down onto the top side of wafer 112. In one embodiment, the distance, X, that wafer backing plate 106 is disposed below wafer 112 is in a range from about 80 thousandths of an inch to about 275 thousandths of an inch.

In addition to serving as one of the boundaries that define volume 118, wafer backing plate 106 also functions to block particles from contacting the backside of wafer 112. For example, wafer backing plate 106 blocks particles recirculating in eddies that extend below wafer 112, as indicated by arrow 120 in FIG. 3. In one embodiment, the shape of wafer backing plate 106 substantially corresponds to that of wafer 112 so that the entire backside of the wafer is shielded from recirculating particles. It will be apparent to those skilled in the art, however, that the shape of wafer backing plate 106 may be varied slightly from that of wafer 112 while still providing effective shielding. By way of example, wafer backing plate 106 need not include the flat edges typically ground into a wafer to indicate crystal orientation and dopant type.

Figure 4:
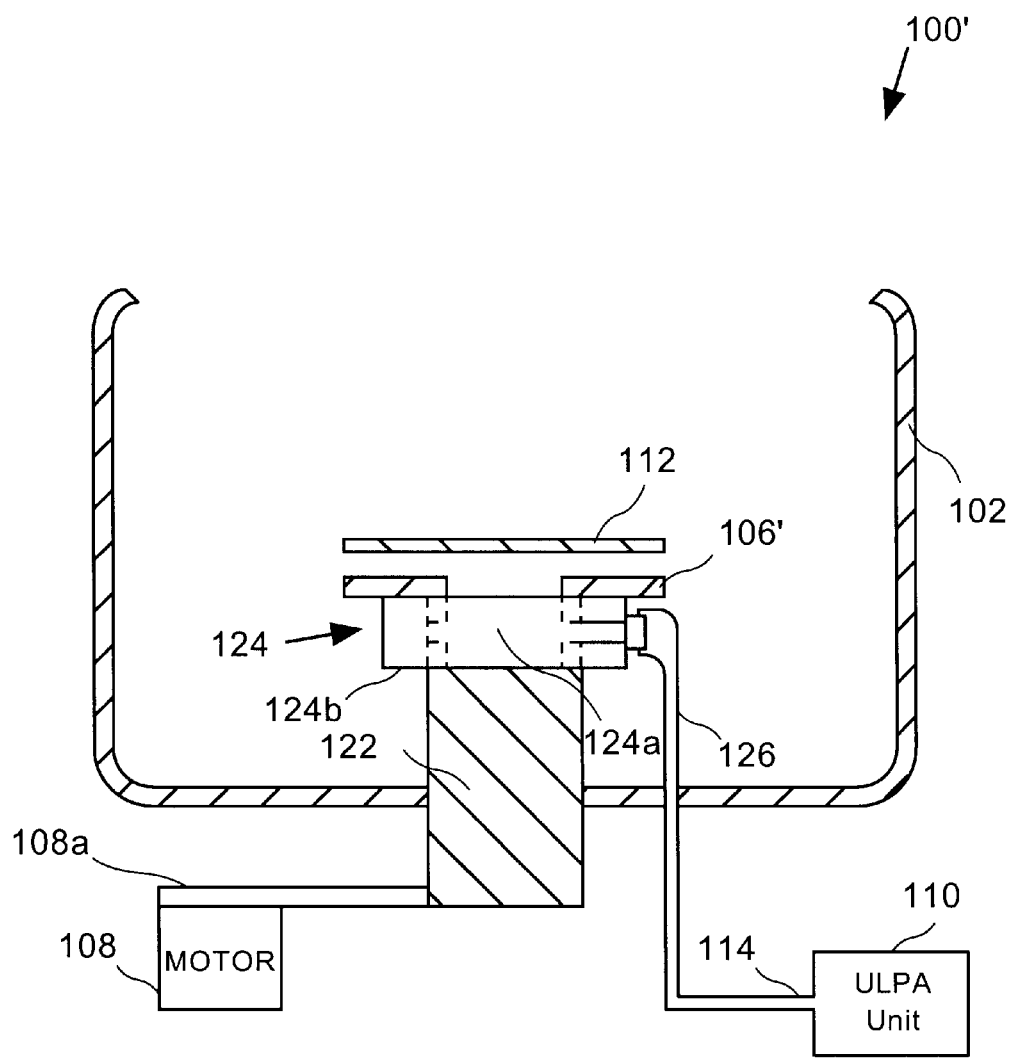
FIG. 4 is a simplified schematic diagram of an SRD module in accordance with another embodiment of the invention.

FIG. 4 is a simplified schematic diagram of SRD module 100' in accordance with one embodiment of the invention. As shown therein, SRD module 100' includes bowl 102, solid core spindle 122, rotary union 124, wafer backing plate 106', motor 108, drive mechanism 108a, and ultra low penetrating air (ULPA) filter unit 110. Semiconductor wafer 112 may be supported above solid core spindle 122 and wafer backing plate 106' by any suitable support mechanism, e.g., spindle fingers that extend upwardly from a spindle arm coupled to the hollow core spindle. The spindle fingers and spindle arm, which are well known to those skilled in the art, have been omitted from FIG. 4 for ease of illustration. The structure and operation of solid core spindle 122 are well known to those skilled in the art.

Rotary union 124, which includes rotating inner portion 124a and fixed outer portion 124b, is disposed at the upper end of solid core spindle 122. Rotating inner portion 124a is joined to the upper end of solid core spindle 122 with appropriate mechanical fasteners, e.g., screws. Wafer backing plate 106', which has a central aperture formed therein, is fastened to the upper surface of rotating inner portion 124a with appropriate mechanical fasteners, e.g., screws. Drive mechanism 108a, which is driven by motor 108, is coupled to the lower end of solid core spindle 122 for rotating the spindle, as described above with reference to FIG. 2. Air supply tube 114 couples ultra low penetrating air (ULPA) filter unit 110 in flow communication with rotary union air supply tube 126.

Figure 5:
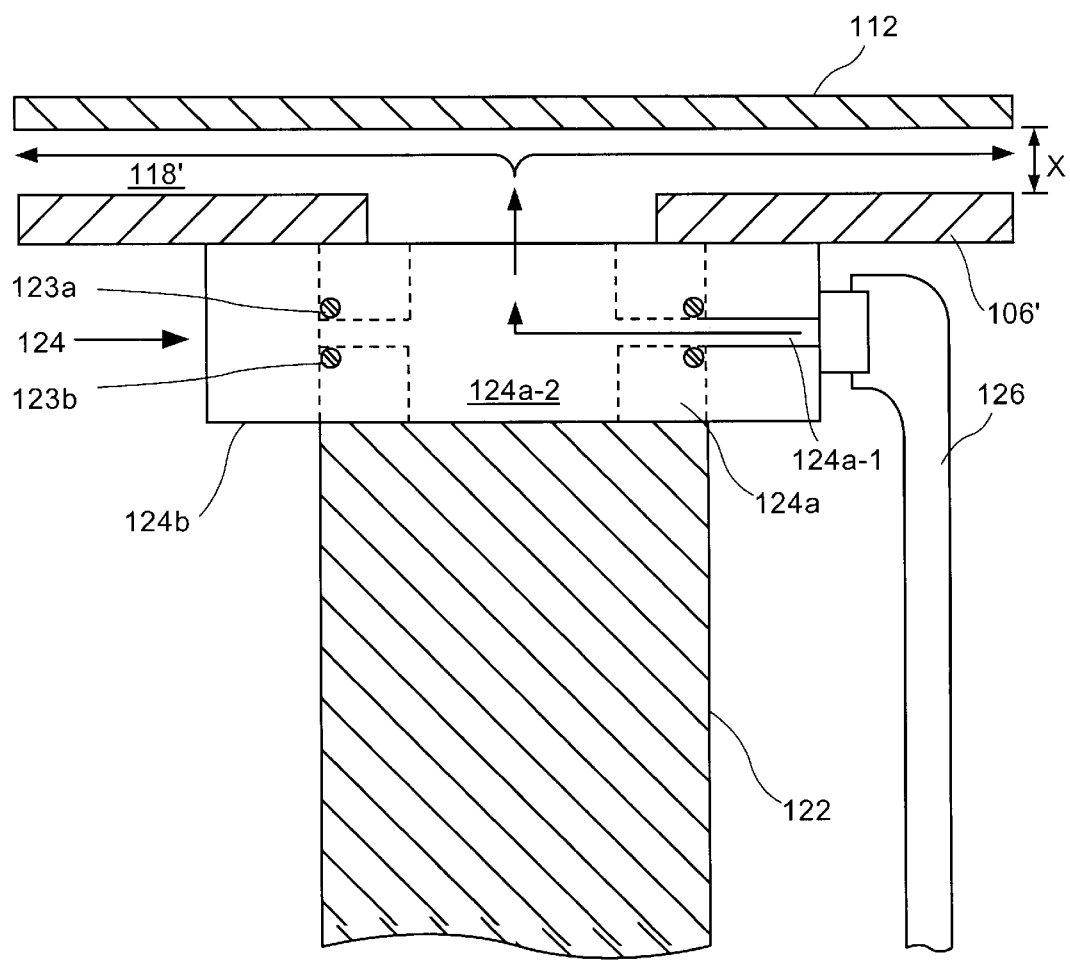
FIG. 5 is an enlarged view of the rotary union shown in FIG. 4 that illustrates the airflow on the backside of the wafer during spin processing.

FIG. 5 is an enlarged view of rotary union 124 shown in FIG. 4 that illustrates the airflow on the backside of wafer 112 during spin processing. As shown in FIG. 5, wafer backing plate 106' and wafer 112 define volume 118' therebetween. During spin processing, solid core spindle 122, rotating inner portion 124a of rotary union 124, wafer backing plate 106', and wafer 112 rotate at substantially the same speed because they are coupled together. As solid core spindle 122, wafer backing plate 106', rotating inner portion 124a, and wafer 112 rotate, clean air from ULPA unit 110 flows up through rotary union air supply tube 126. The clean air flows through channels 124a-1 and 124a-2 in rotary union 124 and into volume 118'. The inner portion of channel 124a-1 is sealed by O-rings 123a and 123b. The clean air entering volume 118' flows outwardly from the center portion of the backside of wafer 112 and exits volume 118' at the outer edges of wafer 112 and wafer backing plate 106', as indicated by the arrows in FIG. 5. The distance, X, that wafer backing plate 106' is disposed below wafer 112 and the airflow into volume 118' from channel 124a-1 may be controlled so that contaminated air does not recirculate into volume 118', as described in detail above with reference to FIG. 3.

Figure 6:
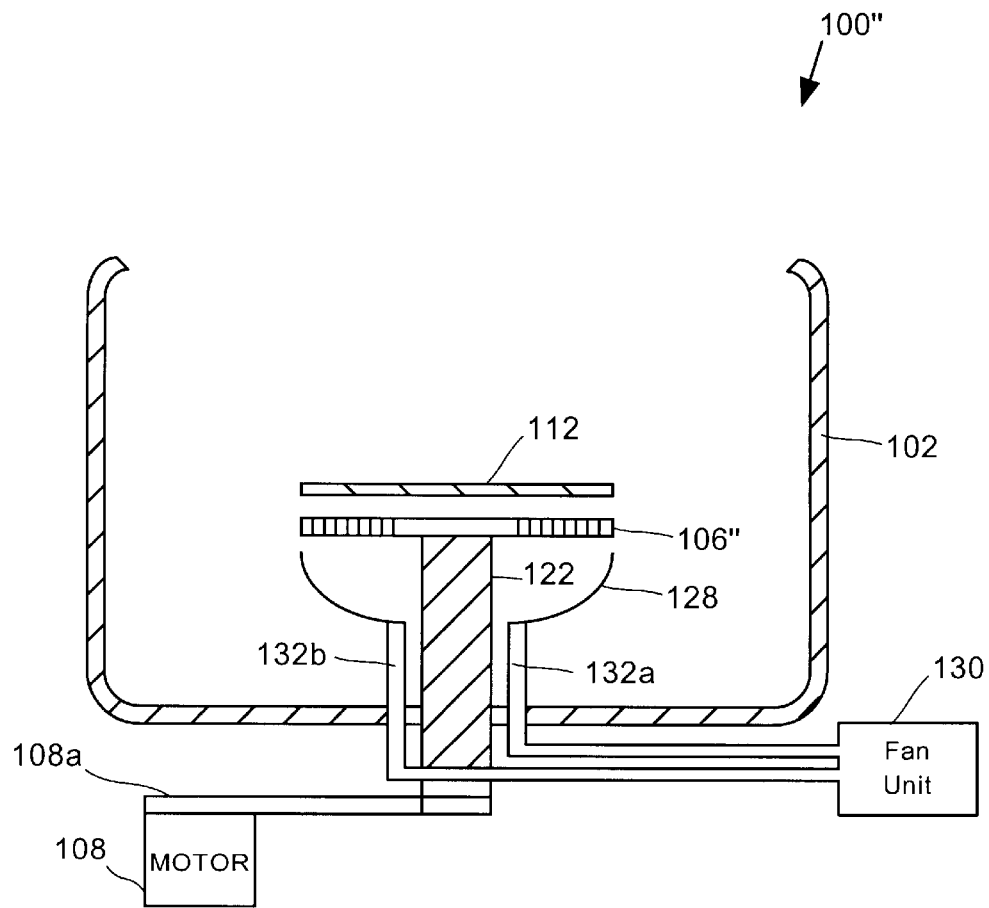
FIG. 6 is a simplified schematic diagram of an SRD module in accordance with yet another embodiment of the invention.

FIG. 6 is a simplified schematic diagram of SRD module 100" in accordance with one embodiment of the invention. As shown therein, SRD module 100" includes bowl 102, solid core spindle 122, wafer backing plate 106", motor 108, drive mechanism 108a, and an air supply system including plenum 128, fan unit 130, and air ducts 132a and 132b. Semiconductor wafer 112 may be supported above solid core spindle 122 and wafer backing plate 106" by any suitable support mechanism, e.g., spindle fingers that extend upwardly from a spindle arm coupled to the hollow core spindle. The spindle fingers and spindle arm, which are well known to those skilled in the art, have been omitted from FIG. 6 for ease of illustration. As noted above, the structure and operation of solid core spindle 122 are well known to those skilled in the art.

Wafer backing plate 106", which has many tiny apertures formed therein, is mounted at the upper end of solid core spindle 122 with appropriate mechanical fasteners, e.g., screws. Drive mechanism 108a, which is driven by motor 108, is coupled to the lower end of solid core spindle 122 for rotating the spindle, as described above with reference to FIG. 2. Air ducts 132a and 132b channel air from fan unit 130 to plenum 128, which is disposed in bowl 102 below wafer backing plate 106". Fan unit 130 includes a suitable filter, e.g., an ULPA filter or a high efficiency particulate arresting (HEPA) filter, for filtering the air supplied therefrom.

Figure 7:
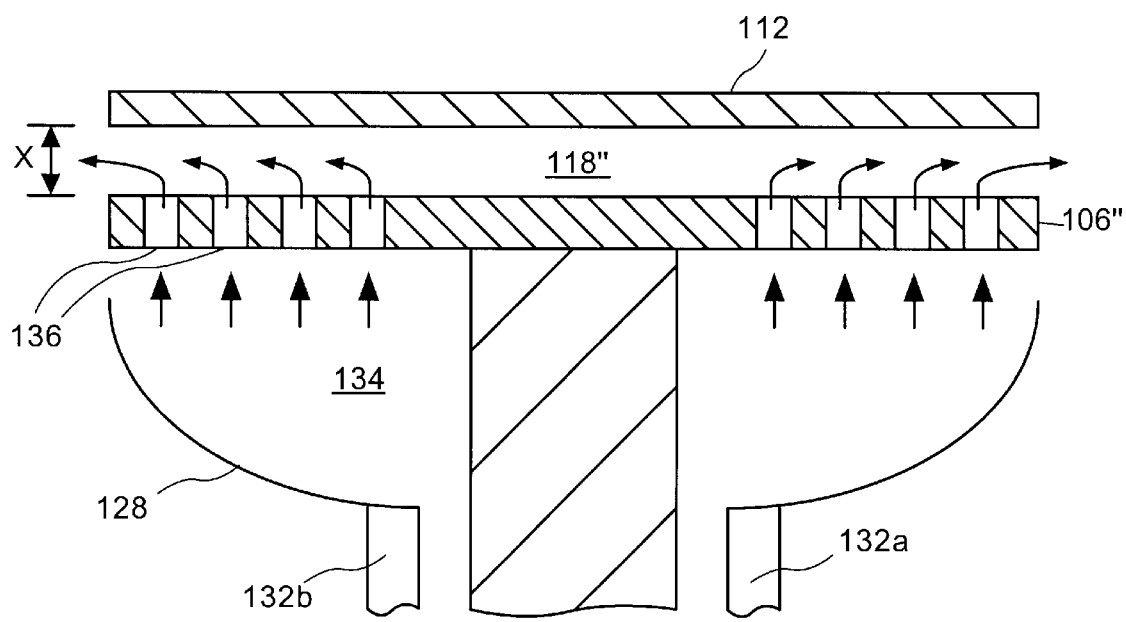
FIG. 7 is an enlarged view of the upper end of the solid core spindle shown in FIG. 6 that illustrates the airflow on the backside of the wafer during spin processing.

FIG. 7 is an enlarged view of the upper end of solid core spindle 122 shown in FIG. 6 that illustrates the airflow on the backside of wafer 112 during spin processing. As shown in FIG. 7, wafer backing plate 106" and wafer 112 define volume 118" therebetween. During spin processing, solid core spindle 122, wafer backing plate 106", and wafer 112 rotate at substantially the same speed because they are coupled together. As solid core spindle 122, wafer backing plate 106", and wafer 112 rotate, clean air from fan unit 130 flows through air ducts 132a and 132b to plenum 128 and enters volume 134 defined between wafer backing plate 106" and plenum 128. Once the clean air has overpressurized volume 134, the clean air flows through apertures 136 in wafer backing plate 106" into volume 118". The clean air entering volume 118" flows outwardly from the point at which it enters volume 118" and exits volume 118' at the outer edges of wafer 112 and wafer backing plate 106', as indicated by the arrows in FIG. 7. The distance, X, that wafer backing plate 106" is disposed below wafer 112 and the airflow into volume 118" from volume 134 may be controlled so that contaminated air does not recirculate into volume 118", as described in detail above with reference to FIG. 3.

The size of apertures 136 formed in wafer backing plate 106" is selected to allow air to pass through the wafer backing plate without allowing DI water droplets to pass through the wafer backing plate. In one embodiment, apertures 136 have a diameter in the range from about 5 thousandths of an inch to about 75 thousandths of an inch. The number of apertures 136 formed in wafer backing plate 106" is selected to ensure that sufficient air passes through the wafer backing plate to avoid recirculation of contaminated air into volume 118". In one embodiment, the number of apertures 136 is in the range from about 500 to about 2,000. To promote uniform pressure distribution in volume 118", apertures 136 may be uniformly distributed throughout wafer backing plate 106".

Figure 8:
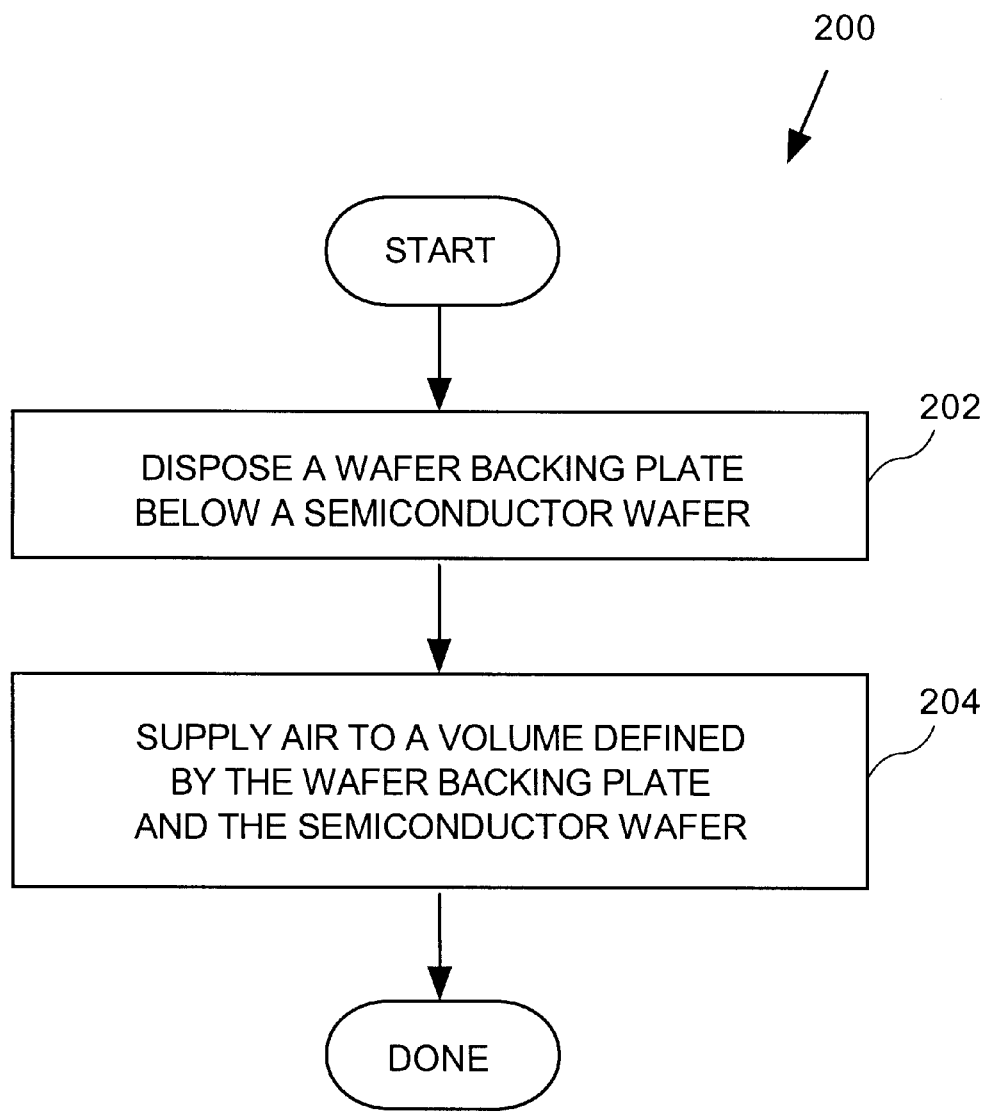
FIG. 8 is a flowchart diagram illustrating the method operations performed in controlling airflow on a backside of a semiconductor wafer during spin processing in accordance with one embodiment of the present invention.

FIG. 8 is a flowchart diagram 200 illustrating the method operations performed in controlling airflow on a backside of a semiconductor wafer during spin processing in accordance with one embodiment of the present invention. The method begins in operation 202 in which a wafer backing plate is disposed below a semiconductor wafer. By way of example, the wafer backing plate may be one of wafer backing plates 106, 106', and 106" described herein. As described above, the shape of wafer backing plates 106, 106', and 106" substantially corresponds to that of a semiconductor wafer. Wafer backing plates 106, 106', and 106" may be disposed below a semiconductor wafer in an SRD module in the configuration shown in FIGS. 2, 4, and 6, respectively.

Next, in operation 204, air is supplied to a volume defined by the wafer backing plate and the semiconductor wafer. In one embodiment, the air is supplied to the volume through a hollow core spindle as shown in FIG. 2. In another embodiment, the air is supplied to the volume through a rotary union as shown in FIG. 4. In the embodiments shown in FIGS. 2 and 4, the air is supplied to the volume proximate to the center portion of the backside of the semiconductor wafer. In yet another embodiment, the air is supplied to the volume through a plurality of apertures formed in the wafer backing plate as shown in FIG. 6. In this embodiment, the air is supplied to the volume peripheral to the center portion of the backside of the semiconductor wafer. Once the air is supplied to the volume, the method is done.

It will be apparent to those skilled in the art that the airflow on the backside of the wafer may be controlled by varying the separation distance between the wafer and the wafer backing plate and by varying the flow rate of air into the volume. As described above, the distance that the wafer backing plate is disposed below the wafer and the airflow into the volume may be controlled so that contaminated air does not recirculate into the volume. In one embodiment, the distance the wafer backing plate is disposed below the semiconductor wafer is in the range from about 80 thousandths of an inch to about 275 thousandths of an inch. In one embodiment, the operation of supplying air to the volume includes controlling the flow rate of the air supplied to the volume to avoid any substantial recirculation of contaminated air into the volume. By way of example, the flow rate of the air supplied to the volume may be varied in the range from about 0.25 scfm to about 75 scfm, depending on the separation distance between the wafer and the wafer backing plate and other parameters, e.g., the airflow into the module and the spindle speed.

The present invention also provides a method for reducing particle recontamination on a backside of a semiconductor wafer during spin processing. By disposing a wafer backing plate below a semiconductor wafer in the manner described herein, particles may be prevented from contacting the backside of the semiconductor wafer during spin processing. For example, with reference to FIG. 3, wafer backing plate 106 blocks particles recirculating in eddies that extend below wafer 112, as indicated by arrow 120. In addition to being carried out in an SRD module as described herein, the method for reducing particle recontamination on a backside of a semiconductor wafer also may be carried out in other processing modules, e.g., a chemical processing module.

The method for controlling airflow on a backside of a semiconductor wafer during spin processing of the present invention advantageously minimizes contamination on the backside of the wafer by preventing contaminated air from recirculating in the volume between the wafer and the wafer backing plate. The method further allows for flexible control of the airflow on the backside of the wafer by varying the flow rate into the volume and the separation distance between the wafer and the wafer backing plate. In addition, the wafer backing plate reduces particle recontamination on the backside of the wafer by preventing particles from contacting the backside of the wafer during spin processing.

In summary, the present invention provides a method for controlling airflow on a backside of a semiconductor wafer during spin processing and a method for reducing particle recontamination on a backside of a semiconductor wafer during spin processing. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A method for controlling airflow on a backside of a semiconductor wafer during spin processing, comprising:
   disposing a wafer backing plate below a semiconductor wafer; and
   supplying air to a volume defined by the wafer backing plate and the semiconductor wafer, wherein the air is supplied to the volume proximate to a center portion of a backside of the semiconductor wafer, and wherein the air is supplied to the volume through a hollow core spindle.

2. The method of claim 1, wherein a distance the wafer backing plate is disposed below the semiconductor wafer is in a range from about 80 thousandths of an inch to about 275 thousandths of an inch.

3. The method of claim 1, wherein the operation of supplying air to the volume includes:
   controlling a flow rate of the air supplied to the volume to avoid any substantial recirculation of contaminated air into the volume.

4. The method of claim 1, wherein a speed at which the semiconductor wafer rotates during spin processing is substantially the same as a speed at which the wafer backing plate rotates during spin processing.

5. The method of claim 1, wherein the wafer backing plate has a shape that substantially corresponds with a shape of the semiconductor wafer.

6. A method for controlling airflow on a backside of a semiconductor wafer during spin processing, comprising:
   disposing a wafer backing plate below a semiconductor wafer; and
   supplying air to a volume defined by the wafer backing plate and the semiconductor wafer, wherein the air is supplied to the volume proximate to a center portion of a backside of the semiconductor wafer, and wherein the air is supplied to the volume through a rotary union.

7. A method for controlling airflow on a backside of a semiconductor wafer during spin processing, comprising:
   disposing a wafer backing plate below a semiconductor wafer, the wafer backing plate having a plurality apertures formed therein; and
   supplying air to a volume defined by the wafer backing plate and the semiconductor wafer, wherein the air is supplied to the volume proximate to a center portion of a backside of the semiconductor wafer, and wherein the air is supplied to the volume through the plurality of apertures.

8. The method of claim 7, wherein the air supplied to the volume is provided by an air supply system including a plenum disposed below the wafer backing plate, a fan provided with one of a HEPA filter and an ULPA filter, and an air duct for channeling air from the fan to the plenum.

9. A method for controlling airflow on a backside of a semiconductor wafer during spin processing, comprising:
   disposing a wafer backing plate a distance below a semiconductor wafer, the distance being in a range from about 80 thousandths of an inch to about 275 thousandths of an inch; and
   supplying air to a volume defined by the wafer backing plate and the semiconductor wafer through a hollow core spindle.

10. The method of claim 9, wherein the air is supplied to the volume proximate to a center portion of a backside of the semiconductor wafer.

11. The method of claim 9, wherein the operation of supplying air to the volume includes:
    controlling a flow rate of the air supplied to the volume to avoid any substantial recirculation of contaminated air into the volume.

12. The method of claim 9, wherein a speed at which the semiconductor wafer rotates during spin processing is substantially the same as a speed at which the wafer backing plate rotates during spin processing.

13. The method of claim 9, wherein the wafer backing plate has a shape that substantially corresponds with a shape of the semiconductor wafer.

14. A method for reducing a particle recontamination on a backside of a semiconductor wafer during spin processing in a spin, rinse, and dry module, comprising:
    disposing a wafer backing plate below a semiconductor wafer to prevent particles from contacting a backside of the semiconductor wafer.

15. The method of claim 14, wherein a distance the wafer backing plate is disposed below the semiconductor wafer is in a range from about 80 thousandths of an inch to about 275 thousandths of an inch.

16. The method of claim 14, wherein a speed at which the semiconductor wafer rotates during spin processing is substantially the same as a speed at which the wafer backing plate rotates during spin processing.

17. The method of claim 14, wherein the wafer backing plate has a shape that substantially corresponds with a shape of the semiconductor wafer.

* * * * *